(12) United States Patent
Tang

(10) Patent No.: US 10,276,642 B2
(45) Date of Patent: Apr. 30, 2019

(54) TOP-EMITTING OLED DISPLAY UNIT, METHOD FOR MANUFACTURING THE SAME, AND DISPLAY PANEL

(71) Applicant: Wuhan China Star Optoelectronics Technology Co., Ltd., Wuhan, Hubei (CN)

(72) Inventor: Yuejun Tang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 15/327,135

(22) PCT Filed: Dec. 30, 2016

(86) PCT No.: PCT/CN2016/113703
§ 371 (c)(1),
(2) Date: Jan. 18, 2017

(87) PCT Pub. No.: WO2018/120108
PCT Pub. Date: Jul. 5, 2018

(65) Prior Publication Data
US 2018/0212008 A1 Jul. 26, 2018

(51) Int. Cl.
| | |
|---|---|
| *H01L 27/14* | (2006.01) |
| *H01L 27/32* | (2006.01) |
| *H01L 51/52* | (2006.01) |
| *H01L 51/56* | (2006.01) |

(52) U.S. Cl.
CPC ...... *H01L 27/3248* (2013.01); *H01L 27/3246* (2013.01); *H01L 51/5212* (2013.01);
(Continued)

(58) Field of Classification Search
CPC ............. H01L 27/3246; H01L 51/5212; H01L 51/5221; H01L 51/56
(Continued)

(56) References Cited

U.S. PATENT DOCUMENTS 9,093,328 B2 * 7/2015 Yamazaki ........... H01L 27/1225
9,570,523 B2 * 2/2017 Kim .................... H01L 27/3248
(Continued)

FOREIGN PATENT DOCUMENTS

| CN | 102664187 | 9/2012 |
|---|---|---|
| CN | 102779830 | 11/2012 |

(Continued)

OTHER PUBLICATIONS

Search Report and Written Opinion, dated Dec. 27, 2016, for International Application No. PCT/CN2016/113703.
(Continued)

*Primary Examiner* — Tan N Tran

(57) ABSTRACT

Disclosed are a top-emitting OLED display unit, a method for manufacturing the same, and a display panel. The top-emitting OLED display unit includes a first electrode serving as a common electrode, a light-emitting material layer disposed above the first electrode, and a second electrode disposed above the light-emitting material layer, the second electrode serving as a pixel electrode. A manufacture process of the first electrode and the second electrode can be simplified by means of the OLED display unit, and it is beneficial for reducing consumption of electrode materials.

14 Claims, 5 Drawing Sheets

(52) U.S. Cl.
CPC .......... *H01L 51/5221* (2013.01); *H01L 51/56* (2013.01); *H01L 2227/323* (2013.01); *H01L 2251/301* (2013.01); *H01L 2251/305* (2013.01); *H01L 2251/306* (2013.01); *H01L 2251/308* (2013.01); *H01L 2251/5315* (2013.01); *H01L 2251/5353* (2013.01); *H01L 2251/558* (2013.01)

(58) Field of Classification Search
USPC .............................................. 257/40, 59, 72
See application file for complete search history.

(56) References Cited

U.S. PATENT DOCUMENTS

| | | |
|---|---|---|
| 2002/0158835 A1 | 10/2002 | Kobayashi et al. |
| 2005/0242350 A1 | 11/2005 | Bae et al. |
| 2013/0044095 A1 | 2/2013 | Heo et al. |
| 2015/0028292 A1 | 1/2015 | Kang |

FOREIGN PATENT DOCUMENTS

| | | |
|---|---|---|
| CN | 103928474 | 7/2014 |
| CN | 104253148 | 12/2014 |
| CN | 105118850 | 12/2015 |
| CN | 105932028 | 9/2016 |
| CN | 106098710 | 11/2016 |
| EP | 1884998 | 2/2008 |

OTHER PUBLICATIONS

Office Action and Search Report, dated Oct. 30, 2017, for Chinese Patent Application No. 201611227134.2.

* cited by examiner

TOP-EMITTING OLED DISPLAY UNIT, METHOD FOR MANUFACTURING THE SAME, AND DISPLAY PANEL

CROSS-REFERENCE TO RELATED APPLICATIONS

The present application claims the priority of Chinese patent application CN201611227134.2, entitled "Top-emitting OLED display unit, method for manufacturing the same, and display panel" and filed on Dec. 27, 2016, the entirety of which is incorporated herein by reference.

FIELD OF THE INVENTION

The present disclosure relates to the field of display technology, and in particular, to a top-emitting OLED display unit, a method for manufacturing the same, and a display panel.

BACKGROUND OF THE INVENTION

An organic light emitting diode (OLED) display device has been widely used because of its advantages. The OLED display device is lightweight and foldable, has a wide viewing angle, and can be produced with low cost.

FIG. 1 schematically shows a structure of a conventional top-emitting OLED light-emitting display unit in the prior art. As shown in the figure, the top-emitting OLED light-emitting display unit comprises a first electrode 101 disposed on a substrate 1. The first electrode 101 is an anode, and is a reflective electrode. Meanwhile, the first electrode 101 serves as a pixel electrode in a display device, and is formed by a conductive metal having a high work function. The anode is generally a two-layer structure comprising a reflective layer and a transparent layer. The top-emitting OLED light-emitting display unit further comprises a second electrode 301 disposed above a light-emitting material layer 201. The second electrode 301 is a cathode, and is formed by a conductive metal having a low work function. Unlike an anode electrode, formation of a cathode electrode requires an application of a common voltage to a pixel unit. Thus, in order to facilitate the application of a common voltage to all pixel units, the cathode electrode has a structure of a common electrode for communicating each pixel unit.

It can be seen, from the structure of the above top-emitting OLED light-emitting display unit, that the first electrode 101 requires a two-layer structure to ensure that light can be reflected and that a thickness of the second electrode 301 needs to be strictly controlled to ensure that the light can be transmitted. As a result, in an existing manufacture process, consumption of electrode layer materials for making the first electrode is relatively large, and a process for controlling the second electrode is relatively complicated.

The present disclosure provides a solution to the above-mentioned problem.

SUMMARY OF THE INVENTION

One of the technical problems to be solved by the present disclosure is how to simplify a manufacture process of an existing top-emitting OLED display unit and reduce material consumption.

To solve the above technical problem, a top-emitting OLED display unit is provided in embodiments of the present application. The top-emitting OLED display unit comprises: a first electrode disposed above a planarization layer adjacent to a substrate and formed by a conductive metal having a low work function, the first electrode serving as a common electrode for reflecting light emitted by a light-emitting material layer; a light-emitting material layer disposed above the first electrode for emitting light under an applied electric field to form an image display; and a second electrode disposed above the light-emitting material layer and formed by a conductive metal having a high work function, the second electrode serving as a pixel electrode for transmitting the light emitted by the light-emitting material layer and the light reflected by the first electrode.

Preferably, the conductive metal having a low work function comprises magnesium, calcium, aluminum, silver, or the conductive metal having a low work function is an alloy composed of at least two of magnesium, calcium, aluminum and silver.

Preferably, a thickness of the first electrode is configured such that a reflectivity of the first electrode is greater than 30%.

Preferably, the second electrode is a transparent electrode.

Preferably, the conductive metal having a high work function comprises indium tin oxide, indium zinc oxide, tin oxide or zinc oxide.

Preferably, a pixel-defining layer is further disposed between the first electrode and the second electrode, and a reserved electrode is disposed between the pixel-defining layer and the planarization layer. The reserved electrode is connected to a pixel voltage signal output terminal of a driving circuit via a first through-hole in the planarization layer, and the second electrode is connected to the reserved electrode via a second through-hole in the pixel-defining layer.

Preferably, the reserved electrode and the first electrode are manufactured by a same material.

Preferably, an auxiliary electrode is further comprised, which is disposed below the pixel-defining layer and above the first electrode.

A method for manufacturing the OLED display unit is further provided in the embodiments of the present application. The method comprises the following steps: forming a first through-hole in a planarization layer adjacent to a substrate, a bottom of the first through-hole being communicated to a pixel voltage signal output terminal of a driving circuit; forming a conductive metal layer above the planarization layer for constituting a first electrode; patterning the conductive metal layer to form a first electrode and a reserved electrode; forming an auxiliary electrode above the first electrode; forming a pixel-defining layer above the reserved electrode and the auxiliary electrode; forming a second through-hole and a light-emitting material layer receiving region in the pixel-defining layer and communicating a bottom of the second through-hole to the reserved electrode; forming a light-emitting material layer in the light-emitting material layer receiving region; and forming a second electrode above the pixel-defining layer and the light-emitting material layer.

Further, a top-emitting OLED display panel is provided, which comprises the top-emitting OLED display unit. First electrodes of respective top-emitting OLED display units are interconnected.

Compared with the prior art, one or more embodiments of the above solution can have the following advantages or benefits:

The first electrode (cathode) is disposed below the light-emitting material layer, and the second electrode (anode) is disposed above the light-emitting material layer. Moreover, the anode serves as the pixel electrode, and the cathode serves as the common electrode having a cavity where the anode is directed. By means of the above arrangements, a manufacture production process of the first electrode and the second electrode can be simplified, and it is beneficial for reducing consumption of electrode materials.

Other features, objectives and advantages of the present disclosure will be further explained in the following description, and will partly become self-evident for those skilled in the art based on a study and research on the following text, or can be taught through an implementation of the present disclosure. The objectives and other advantages of the present disclosure will be achieved through structures specifically pointed out in the description, claims, and the accompanying drawings.

BRIEF DESCRIPTION OF THE DRAWINGS

The drawings are provided for further understanding technical solutions of the present disclosure or the prior art, and constitute one part of the description. The drawings are used for explaining the technical solutions of the present application in conjunction with the embodiments, rather than limiting the technical solutions of the present application. In the drawings.

DETAILED DESCRIPTION OF THE EMBODIMENTS

The present disclosure will be further explained in detail with reference to the accompanying drawings and embodiments, so that one can fully understand how the present disclosure solves the technical problems and achieves corresponding technical effects through technical means, thereby implementing the same. It should be noted that as long as there is no structural conflict, any of the embodiments of the present disclosure and any of the technical features in the embodiments can be combined with one another, and the technical solutions obtained therefrom all fall within the scope of the present disclosure.

Figure 1:
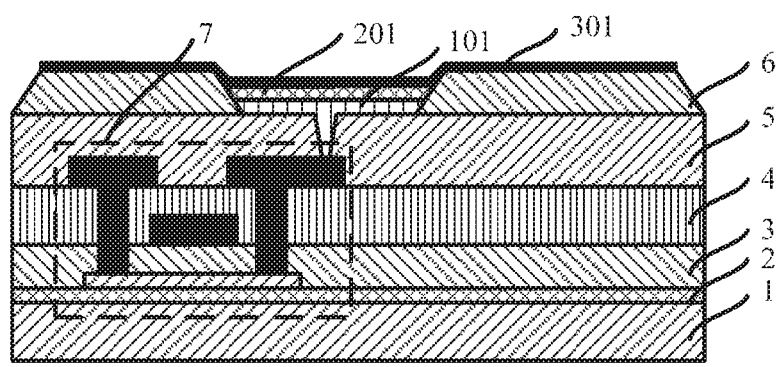
FIG. 1 schematically shows a structure of a conventional top-emitting OLED light-emitting display unit in the prior art.
Figure 2:
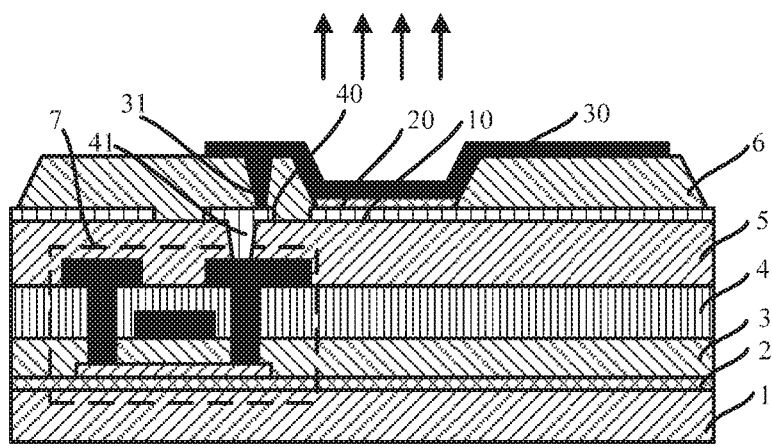
FIG. 2 schematically shows a structure of a top-emitting OLED display unit according to a first embodiment of the present disclosure.

FIG. 2 schematically shows a structure of a top-emitting OLED display unit according to a first embodiment of the present disclosure. As shown in the figure, the film layers in the figure sequentially comprise, from bottom to top, a substrate 1, a buffer layer 2, a gate insulating layer 3, an interlayer insulating layer 4, a planarization layer 5 and a pixel-defining layer 6. The top-emitting OLED display unit of the present embodiment comprises a first electrode 10, a light-emitting material layer 20 and a second electrode 30.

The first electrode 10 is disposed above the planarization layer adjacent to the substrate 1. The first electrode 10 is a cathode, and the first electrode 10 is a reflective electrode for reflecting light emitted by the light-emitting material layer 20.

The first electrode 10 is formed by a conductive metal having a low work function. For example, the metal is selected from magnesium Mg, calcium Ca, aluminum Al, silver Ag, or an alloy composed of at least two of magnesium, calcium, aluminum and silver. Moreover, the first electrode 10 is formed with a thickness sufficient to reflect the light by these materials. The thickness sufficient to reflect the light, for example, allows a light reflectivity of the first electrode 10 to be greater than 30%.

When the top-emitting OLED display unit of the present embodiment is used to form a display panel, the first electrode 10 is used as a common electrode of the display panel, and first electrodes of respective OLED display units are interconnected as a whole and are configured to receive a voltage signal of the common electrode.

The light-emitting material layer 20 is disposed above the first electrode 10, is mainly formed by an organic electroluminescent material, and can emit light under an applied electric field to form an image display.

The second electrode 30 is disposed above the light-emitting material layer 20, and the second electrode 30 is an anode. For the top-emitting OLED display unit, the second electrode 30 is a transparent electrode and is mainly used for transmitting the light emitted by the light-emitting material layer 20 and the light reflected by the first electrode 10.

Besides, the second electrode 30 is an anode, and thus needs to be formed by a conductive metal having a high work function. Thus, in the present embodiment, an electrode material layer for the second electrode 30 is selected from an indium tin oxide (ITO) layer, an indium zinc oxide (IZO) layer, a tin oxide (SnO) layer or a zinc oxide (ZnO) layer.

When the top-emitting OLED display unit of the present embodiment is used to form a display panel, the second electrode 30 serves as a pixel electrode of the display panel, and second electrodes 30 of respective top-emitting OLED display units can respectively receive different pixel voltage signals.

In the present embodiment, as the second electrode 30 is disposed above the first electrode 10 and the second electrode 30 serves as a transmission electrode, the second electrode 30 only needs to be formed as a single layer structure, which can greatly reduce consumption of an electrode material of the second electrode 30.

In the present embodiment, as the second electrode 30 is disposed above the first electrode 10 and the first electrode 10 serves as a reflective electrode, a thickness of the first electrode 10 does not need to be strictly controlled, which facilitates simplifying a manufacture process of the display panel and increasing a yield.

In addition, as a thickness of a cathode (first electrode) covering all pixel electrodes (second electrodes, anodes) in a large-sized display device must be strictly controlled, wire resistance is increased to cause a voltage drop, resulting in non-uniform light emission of the display device and an increase in power consumption. However, in the present embodiment, serving as a reflective electrode, the first electrode (cathode) not only requires no strict control in thickness but also requires a thickness sufficient to have a light-reflecting property, thereby reducing resistance of the cathode and reducing the non-uniform light emission and the increase in power consumption resulting from generation of the voltage drop.

Further, as shown in FIG. 2, a reserved electrode 40 is disposed between the pixel-defining layer 6, which is disposed between the first electrode 10 and the second electrode 30, and the planarization layer 5. The reserved electrode 40 is connected to a pixel voltage signal output terminal, specifically a source/drain of a TFT switch, of a driving circuit via a first through-hole 41 in the planarization layer 5. The second electrode 30 is connected to the reserved electrode 40 via a second through-hole 31 in the pixel-defining layer 6.

It should be noted that the pixel voltage signal output terminal of the driving circuit in the present embodiment is actually one transistor (T2) in a driving unit of an OLED display unit composed of a plurality of thin film transistors 7, and the transistor is indicated by 7 in FIG. 2.

Figure 3:
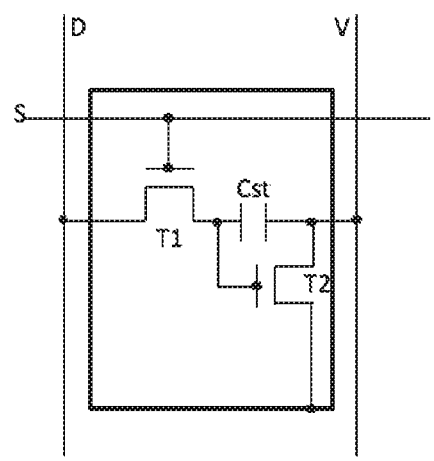
FIG. 3 schematically shows a structure of a driving unit of an OLED display unit.

FIG. 3 schematically shows a structure of a driving unit of an OLED display unit. As shown in the figure, a driving unit circuit is disposed in each pixel region, and a plurality of wires comprising a scan line S, a data line D and a Vdd line V are electrically connected to the driving unit circuit. In some embodiments, according to a configuration of the driving unit circuit, various wires are further provided in addition to the scan line S, the data line D and the Vdd line V (i.e., driving power).

As shown in FIG. 3, the driving unit circuit comprises a first TFT T1 connected to the scan line S and data line D, a second TFT T2 connected to the first TFT T1 and the Vdd line V, and a capacitor Cst connected to the first TFT T1 and the second TFT T2. Here, the first TFT T1 serves as a switching transistor, and the second TFT T2 serves as a driving transistor. In the foregoing embodiments, the second electrode 30 is electrically connected to the second TFT T2.

A number of the TFTs and a number of the capacitors are not limited to those shown in FIG. 3. According to the configuration of the driving unit circuit, a combination of two or more TFTs and one or more capacitors can also be provided. Further, in combination with a position indicated by a dashed box in other drawings of the present application, a dashed box region that is not indicated by a reference numeral shows a position of the first TFT T1, which is disposed below the light-emitting material layer without affecting light emitting display.

It should be noted that the foregoing text is merely illustrative of specific implementation manners of the present disclosure and does not constitute a limitation to the present disclosure.

Further, the reserved electrode 40 and the first electrode 10 are manufactured by a same material. Generally, the reserved electrode 40 and the first electrode 10 are manufactured in a same manufacture process. For details, please see the subsequent description of a method for manufacturing the top-emitting OLED display unit.

Figure 4:
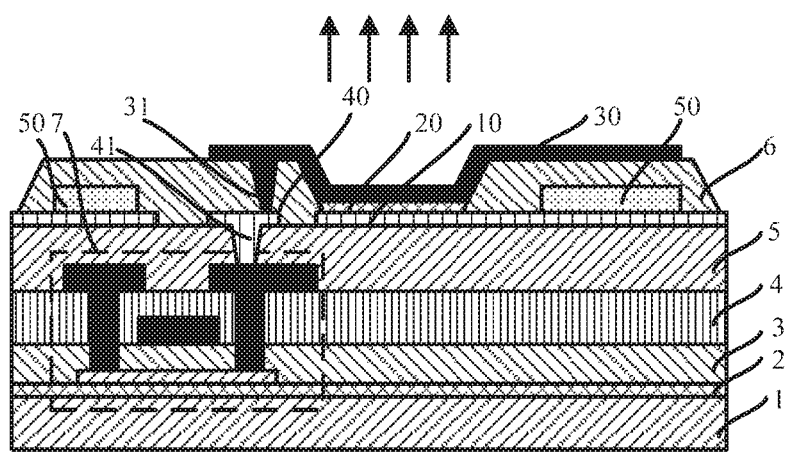
FIG. 4 schematically shows a structure of the top-emitting OLED display unit according to a second embodiment of the present disclosure.

FIG. 4 schematically shows a structure of the top-emitting OLED display unit according to a second embodiment of the present disclosure. As shown in the figure, an auxiliary electrode 50 is disposed below the pixel-defining layer 6 and above the first electrode 10.

A voltage drop caused by an increase in wire resistance of a cathode (first electrode) covering all pixel electrodes (second electrodes, anodes) in a large-sized display device results in non-uniform light emission of the display device and an increase in power consumption, but the non-uniform light emission and the increase in power consumption resulting from generation of the voltage drop can be reduced by providing the auxiliary electrode 50.

The auxiliary electrode 50 can be manufactured by a material same as a material of the first electrode, or by other conductive metal materials, which is not limited in the present embodiment.

As the first electrode 10 of the top-emitting OLED display unit in the present embodiment is disposed below the light-emitting material layer 20, manufacture of the auxiliary electrode 50 is prior to manufacture of the light-emitting material layer 20, which can prevent damage or an aging effect to the light-emitting material layer 20, simplify a manufacture process and facilitate manufacture of the auxiliary electrode 50.

Figure 5:
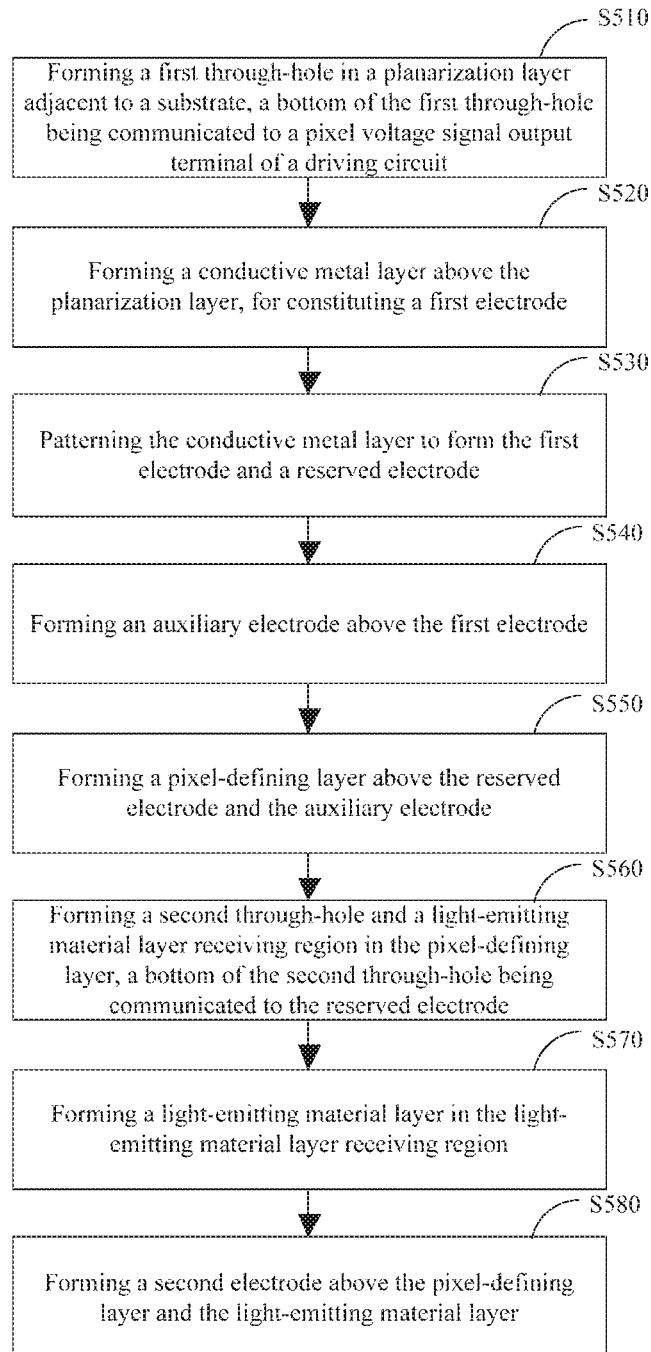
FIG. 5 schematically shows a flow chart of a method for manufacturing the top-emitting OLED display unit according to a third embodiment of the present disclosure.

FIG. 5 schematically shows a flow chart of a method for manufacturing the top-emitting OLED display unit according to a third embodiment of the present disclosure. As shown in the figure, the method specifically comprises the following steps.

Figure 6A:
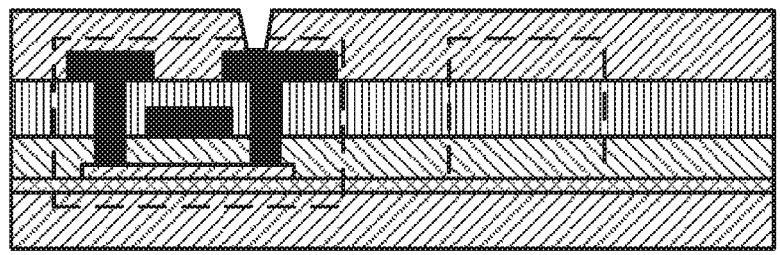
FIGS. 6a-6e schematically show steps for manufacturing the top-emitting OLED display unit according to the third embodiment of the present disclosure.

In step S510, a first through-hole is formed in a planarization layer adjacent to a substrate, and a bottom of the first through-hole is communicated to a pixel voltage signal output terminal of a driving circuit, as shown in FIG. 6a.

In step S520, a conductive metal layer for constituting a first electrode is formed above the planarization layer.

Figure 6B:
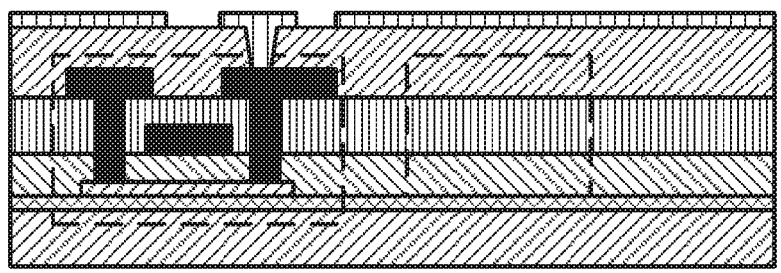

In step S530, the conductive metal layer is patterned to form the first electrode and a reserved electrode. As shown in FIG. 6b, first electrodes, other than reserved electrodes, are communicated, and the reserved electrode is in a form of an island. The first through-hole is filled at the same time when the reserved electrode is manufactured. Thus, the formed reserved electrode is connected to the pixel voltage signal output terminal, i.e. a source/drain of a thin film transistor, of the driving circuit via the first through-hole.

In step S540, an auxiliary electrode is formed above the first electrode.

In step S550, a pixel-defining layer is formed above the reserved electrode and the auxiliary electrodes.

Figure 6C:
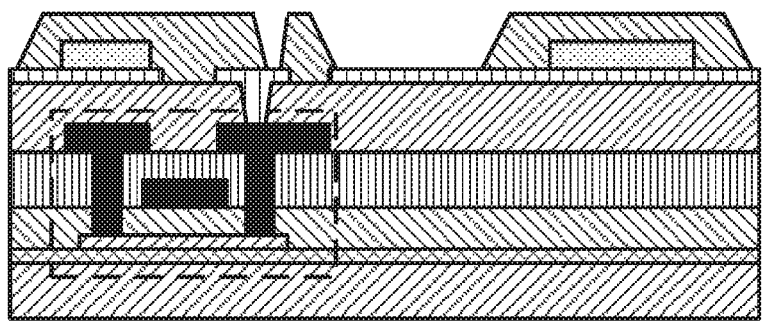

In step S560, a second through-hole and a light-emitting material layer receiving region are formed in the pixel-defining layer, and a bottom of the second through-hole is communicated to the reserved electrode, as shown in FIG. 6c.

Figure 6D:
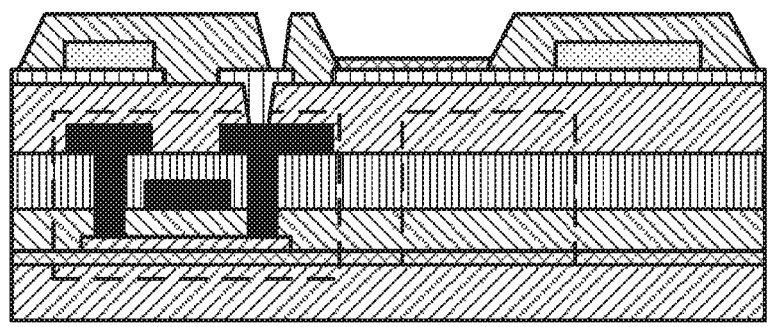

In step S570, a light-emitting material layer is formed in the light-emitting material layer receiving region, as shown in FIG. 6d.

Figure 6E:
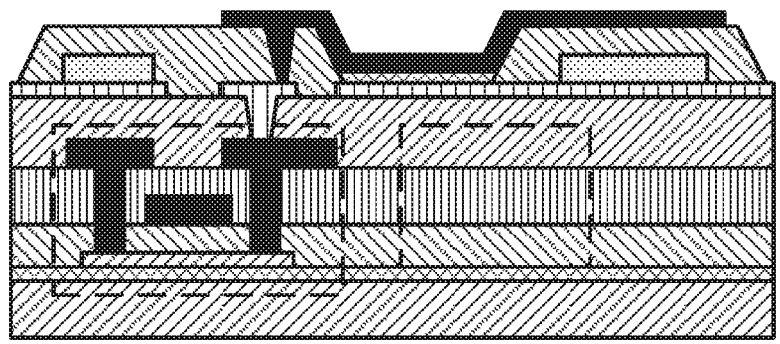

In step S580, a second electrode is formed above the pixel-defining layer and the light-emitting material layer. As shown in FIG. 6e, a metal material fills an interior of the second through-hole at the same time when the metal material forms the second electrode, so that the formed second electrode is connected to the reserved electrode via the second through-hole.

Alternatively, steps S530 and S540 can also be the following steps.

In step S530, the conductive metal layer is patterned to form the first electrode and a reserved region of a reserved electrode. There is no electrode layer in the reserved region of the reserved electrode, reserving a space for subsequent manufacture of the reserved electrode.

In step S540, an auxiliary electrode and the reserved electrode are manufactured. The auxiliary electrode is formed above the first electrode, and the reserved electrode is formed in the reserved region using an auxiliary electrode material. Specifically, a layer of the auxiliary electrode material is manufactured and then patterned by etching to form the auxiliary electrode and reserved electrode. Respective auxiliary electrodes, other than reserved electrodes, are communicated, and the reserved electrode is in a form of an island. The first through-hole is filled at the same time when the reserved electrode is manufactured, so that the formed reserved electrode is connected to the pixel voltage signal output terminal, i.e. a source/drain of a thin film transistor, of the driving circuit via the first through-hole.

It should be noted that it is shown that a semiconductor active layer is made of Poly-Si in schematic views of the embodiments of the present disclosure, but a material for making the semiconductor active layer is not limited to Poly-Si. The semiconductor active layer can also be made of IGZO or a-Si and so on. A top-gate TFT is shown in the schematic views of the embodiments of the present disclosure, but a TFT structure is not limited to the top-gate TFT. The TFT structure can also be a bottom-gate TFT or other TFT device structures suitable for the semiconductor active layer.

In the embodiments of the present disclosure, the anode is arranged to be a patterned pixel electrode disposed above the light-emitting material layer, and the cathode is arranged to be a common electrode having a cavity where the anode is directed. In this way, the anode disposed above the light-emitting material layer is formed by a layer of a transparent electrode having a high work function only, thereby simplifying anode manufacture and reducing electrode material consumption. Moreover, the cathode is a common electrode and is disposed below the light-emitting material layer, which facilitates manufacture of the auxiliary electrode.

A top-emitting OLED display device is taken as an example to illustrate the present disclosure, but the example is not limited to the top-emitting OLED display device. For example, a transparent OLED display device can also be taken as an example.

Although the embodiments of the present disclosure are provided as above, the above embodiments are only for better understanding, rather than restricting the present disclosure. Anyone skilled in the art can make amendments or changes to the implementing forms and details without departing from the spirit and scope of the present disclosure. The scope of the present disclosure should be subject to the scope defined in the claims.

The invention claimed is:

1. A top-emitting OLED display unit, which comprises:
a first electrode disposed above a planarization layer adjacent to a substrate and formed by a conductive metal having a low work function, the first electrode serving as a common electrode for reflecting light emitted by a light-emitting material layer;
a light-emitting material layer disposed above the first electrode for emitting light under an applied electric field to form an image display; and
a second electrode disposed above the light-emitting material layer and formed by a conductive metal having a high work function, the second electrode serving as a pixel electrode for transmitting the light emitted by the light-emitting material layer and the light reflected by the first electrode;
wherein a pixel-defining layer is further disposed between the first electrode and the second electrode, and a reserved electrode is disposed between the pixel-defining layer and the planarization layer, wherein the reserved electrode is connected to a pixel voltage signal output terminal of a driving circuit via a first through-hole in the planarization layer, and the second electrode is connected to the reserved electrode via a second through-hole in the pixel-defining layer.

2. The OLED display unit according to claim 1, wherein the conductive metal having a low work function comprises magnesium, calcium, aluminum, silver, or
the conductive metal having a low work function is an alloy composed of at least two of magnesium, calcium, aluminum and silver.

3. The OLED display unit according to claim 1, wherein a thickness of the first electrode is configured such that a light reflectivity of the first electrode is greater than 30%.

4. The OLED display unit according to claim 1, wherein the second electrode is a transparent electrode.

5. The OLED display unit according to claim 4, wherein the conductive metal having a high work function comprises indium tin oxide, indium zinc oxide, tin oxide or zinc oxide.

6. The OLED display unit according to claim 1, wherein the reserved electrode and the first electrode are manufactured by a same material.

7. The OLED display unit according to claim 6, wherein an auxiliary electrode is further comprised, which is disposed below the pixel-defining layer and above the first electrode.

8. A top-emitting OLED display panel, which comprises a top-emitting OLED display unit, the top-emitting OLED display unit comprising:
a first electrode disposed above a planarization layer adjacent to a substrate and formed by a conductive metal having a low work function, the first electrode serving as a common electrode for reflecting light emitted by a light-emitting material layer;
a light-emitting material layer disposed above the first electrode for emitting light under an applied electric field to form an image display; and
a second electrode disposed above the light-emitting material layer and formed by a conductive metal having a high work function, the second electrode serving as a pixel electrode for transmitting the light emitted by the light-emitting material layer and the light reflected by the first electrode,
wherein first electrodes of respective top-emitting OLED display units are interconnected;
wherein a pixel-defining layer is further disposed between the first electrode and the second electrode, and a reserved electrode is disposed between the pixel-defining layer and the planarization layer, wherein the reserved electrode is connected to a pixel voltage signal output terminal of a driving circuit via a first through-hole in the planarization layer, and the second electrode is connected to the reserved electrode via a second through-hole in the pixel-defining layer.

9. The OLED display panel according to claim 8, wherein the conductive metal having a low work function comprises magnesium, calcium, aluminum, silver, or
the conductive metal having a low work function is an alloy composed of at least two of magnesium, calcium, aluminum and silver.

10. The OLED display panel according to claim 8, wherein a thickness of the first electrode is configured such that a light reflectivity of the first electrode is greater than 30%.

11. The OLED display panel according to claim 8, wherein the second electrode is a transparent electrode.

12. The OLED display panel according to claim 11, wherein the conductive metal having a high work function comprises indium tin oxide, indium zinc oxide, tin oxide or zinc oxide.

13. The OLED display panel according to claim 8, wherein the reserved electrode and the first electrode are manufactured by a same material.

14. The OLED display panel according to claim 13, wherein an auxiliary electrode is further comprised, which is disposed below the pixel-defining layer and above the first electrode.

\* \* \* \* \*